(12) United States Patent
Kim et al.

(10) Patent No.: US 10,290,690 B2
(45) Date of Patent: May 14, 2019

(54) ORGANIC LIGHT EMITTING DISPLAY PANEL WITH UNIFORM LUMINANCE

(71) Applicant: LG DISPLAY CO., LTD., Seoul (KR)

(72) Inventors: Suhyeon Kim, Paju-si (KR); Sungbin Shim, Yangsan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 8 days.

(21) Appl. No.: 14/920,077

(22) Filed: Oct. 22, 2015

(65) Prior Publication Data

US 2016/0172634 A1 Jun. 16, 2016

(30) Foreign Application Priority Data

Dec. 15, 2014 (KR) ........................ 10-2014-0179965

(51) Int. Cl.
*H01L 27/32* (2006.01)
*H01L 51/52* (2006.01)

(52) U.S. Cl.
CPC ...... *H01L 27/3258* (2013.01); *H01L 51/5228* (2013.01); *H01L 51/5234* (2013.01); *H01L 27/322* (2013.01); *H01L 27/3246* (2013.01); *H01L 2251/5315* (2013.01)

(58) Field of Classification Search
CPC ............. H01L 27/3258; H01L 51/5228; H01L 27/3288
USPC .................................................... 257/40, 59
See application file for complete search history.

(56) References Cited

U.S. PATENT DOCUMENTS

| | | | | |
|---|---|---|---|---|
| 2005/0051776 A1* | 3/2005 | Miyagi | ................ | G09G 3/3233 257/72 |
| 2007/0120470 A1* | 5/2007 | Im | ....................... | H01L 27/3244 313/504 |
| 2007/0170859 A1* | 7/2007 | Choi | .................... | H01L 27/3276 313/512 |
| 2007/0222380 A1* | 9/2007 | Yamazaki | ........... | H01L 51/0562 313/509 |
| 2008/0246403 A1* | 10/2008 | Sagawa | ................ | G09G 3/3233 315/35 |
| 2009/0302751 A1* | 12/2009 | Hanawa | .............. | H01L 27/3276 313/504 |
| 2010/0060147 A1* | 3/2010 | Eom | .................... | H01L 51/5234 313/504 |
| 2010/0102335 A1* | 4/2010 | Takagi | ................ | H01L 51/5228 257/88 |
| 2014/0367651 A1* | 12/2014 | Song | ................... | H01L 51/5228 257/40 |

(Continued)

*Primary Examiner* — Lex H Malsawma
*Assistant Examiner* — Eric W Jones
(74) *Attorney, Agent, or Firm* — Dentons US LLP

(57) ABSTRACT

Provided is an organic light emitting display panel with uniform luminance. A flattening layer including a contact hole is disposed on a substrate on which an auxiliary electrode is disposed. The contact hole in the flattening layer has an undercut pattern at a point contacting the auxiliary electrode. The organic light emitting layer is disconnected by the contact hole, but the common electrode is connected with the auxiliary electrode at an undercut pattern portion with a high step coverage as compared with the organic light emitting layer. Since the auxiliary electrode and the common electrode are connected with each other through the contact hole having the undercut pattern in the flattening layer, it is possible to preserve uniform luminance of the organic light emitting display panel.

17 Claims, 4 Drawing Sheets

(56) References Cited

U.S. PATENT DOCUMENTS

2015/0014658 A1\* 1/2015 Choung .............. H01L 51/5203
  257/40
2015/0144906 A1\* 5/2015 Ichikawa ............ H01L 51/5228
  257/40

\* cited by examiner

ORGANIC LIGHT EMITTING DISPLAY PANEL WITH UNIFORM LUMINANCE

CROSS-REFERENCE TO RELATED APPLICATIONS

This application claims the priority of Korean Patent Application No. 2014-0179965 filed on Dec. 15, 2014, in the Korean Intellectual Property Office, the disclosure of which is incorporated herein by reference for all purposes as if fully set forth herein.

BACKGROUND

Field of the Invention

The present disclosure relates to an organic light emitting display panel. More particularly, the disclosure relates to an organic light emitting display panel which has a high resolution and a large size by providing a new connection structure of an auxiliary electrode using a contact hole in a flattening layer to provide connectivity between the auxiliary electrode and a common electrode for preserving a uniform luminance.

Description of the Related Art

An organic light emitting display panel is a self-light emitting display device that does not need a separate light source, unlike a liquid crystal display (LCD) device. Thus, the organic light emitting display panel can be manufactured into a lightweight and thin form. Further, the organic light emitting display panel is advantageous in terms of power consumption since it is driven with a low voltage. Also, the organic light emitting display panel has an excellent color expression ability, a high response speed, a wide viewing angle, and a high contrast ratio (CR). Therefore, the organic light emitting display panel has been researched as a next-generation display device.

The organic light emitting display panel is configured to emit light by electrons and holes injected into a light emitting layer. Thus, it is important to uniformly supply a current to the organic light emitting display panel.

Each pixel of the organic light emitting display panel includes an organic light emitting element, a data line and a gate line which cross each other, a driving element connected to the data line and the gate line, and the like.

An oxide thin film transistor driving element including a semiconductor layer formed of an oxide semiconductor exhibits a higher electron drift velocity than an amorphous thin film transistor including a semiconductor layer formed of amorphous silicon. Further, the oxide thin film transistor driving element is manufactured by a simple process at lower manufacturing cost as compared with a polysilicon thin film transistor including a semiconductor layer formed of polysilicon. The oxide thin film transistor driving element has been actively studied.

Further, as organic light emitting display panels are enlarged, many research projects for providing uniform current supply have been conducted. For example, a research project using an auxiliary electrode has been conducted.

SUMMARY

In an organic light emitting display panel, a plurality of pixels including organic light emitting elements is disposed. The organic light emitting elements are configured to emit lights so as to display an image desired by a user.

The organic light emitting element includes two electrodes and an organic layer. Herein, the organic layer includes an organic light emitting layer, and may further include a hole injection layer, a hole transporting layer, an electron transporting layer, an electron injection layer, and the like in order to smoothly generate excitons.

One of the two electrodes may be a pixel electrode connected with a driving element, and the other one may be a common electrode (cathode).

A top-emission organic light emitting display panel generally uses a transparent electrode as the common electrode. The transparent electrode has a high resistance value. Therefore, a current supplied to the organic light emitting element is decreased from a peripheral portion toward a central portion of the organic light emitting display panel due to an increase in an electric resistance of the electrode. Accordingly, luminance is decreased.

It is possible to reduce an electric resistance at the central portion of the panel and thus recover the decreased luminance at the central portion by disposing an auxiliary electrode in the organic light emitting display panel and connecting the auxiliary electrode with the common electrode.

The auxiliary electrode and the common electrode can be connected by using a reverse tapered structure including a wall. If the auxiliary electrode is formed at a lower end of the wall structure and the organic light emitting layer and the common electrode are deposited with a step coverage difference between the organic light emitting layer and the common electrode, the common electrode has a better step coverage than the organic light emitting layer. Therefore, the common electrode is electrically connected with the auxiliary electrode at the lower end of the wall structure.

The wall structure may be formed of a polyimide-based material. However, the wall structure may be easily collapsed during a manufacturing process, and an aperture ratio of the organic light emitting display panel may be decreased. Further, an additional process for forming the wall structure is needed, which may increase manufacturing cost of the organic light emitting display panel. Accordingly, the inventors of the present disclosure invented a connection structure of the auxiliary electrode in the organic light emitting display panel. The connection structure can connect the auxiliary electrode with the common electrode without using the wall structure.

An object to be achieved by the present disclosure is to provide an organic light emitting display panel in which an auxiliary electrode and a common electrode are connected. An auxiliary electrode and a common electrode are connected by using a contact hole having an undercut pattern in a flattening layer on the auxiliary electrode, which simplifies a manufacturing process.

Another object to be achieved by the present disclosure is to provide an organic light emitting display panel which can have a high resolution and a large size due to a connection structure between an auxiliary electrode and a common electrode without requiring a wall structure.

The objects of the present disclosure are not limited to the aforementioned objects, and other objects, which are not mentioned above, will be apparent to a person having ordinary skill in the art from the following description.

According to an aspect of the present disclosure, there is provided an organic light emitting display panel including an auxiliary electrode. At least one driving element and one auxiliary electrode are disposed on a substrate. A flattening layer including a first contact hole corresponding to the driving element and at least one second contact hole is disposed on the driving element.

A pixel electrode and a bank are disposed on the flattening layer. The pixel electrode is connected with the driving element through the first contact hole. An organic light emitting layer and a common electrode are disposed on the pixel electrode. The common electrode is connected with the auxiliary electrode through the second contact hole. The second contact hole has an undercut pattern at a position that is in contact with the auxiliary electrode.

The organic light emitting layer may be present within the second contact hole. The auxiliary electrode and the common electrode are electrically connected with each other due to the undercut pattern of the second contact hole.

Since the second contact hole is disposed in the flattening layer so as to connect the common electrode with the auxiliary electrode, an area of an organic light emitting element including the pixel electrode, the organic light emitting layer, and the common electrode can be maximized. Accordingly, it is possible to simplify a manufacturing process of an organic light emitting display panel and also realize an organic light emitting display panel with a large area and a high resolution.

According to the present disclosure, a contact hole in a flattening layer is used as a connection structure of an auxiliary electrode capable of reducing an electric resistance of a common electrode. Thus, it is possible to improve uniformity in luminance of an organic light emitting display panel.

Further, according to the present disclosure, it is possible to reduce manufacturing cost of an organic light emitting display panel with a large size and a high resolution.

The effects of the present disclosure are not limited to the aforementioned effects, and other effects, which are not mentioned above, will be apparent to a person having ordinary skill in the art from the following description.

The objects to be achieved by the present disclosure, the means for achieving the objects, and effects of the present disclosure described above do not specify essential features of the claims, and, thus, the scope of the claims is not limited to the disclosure of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1:
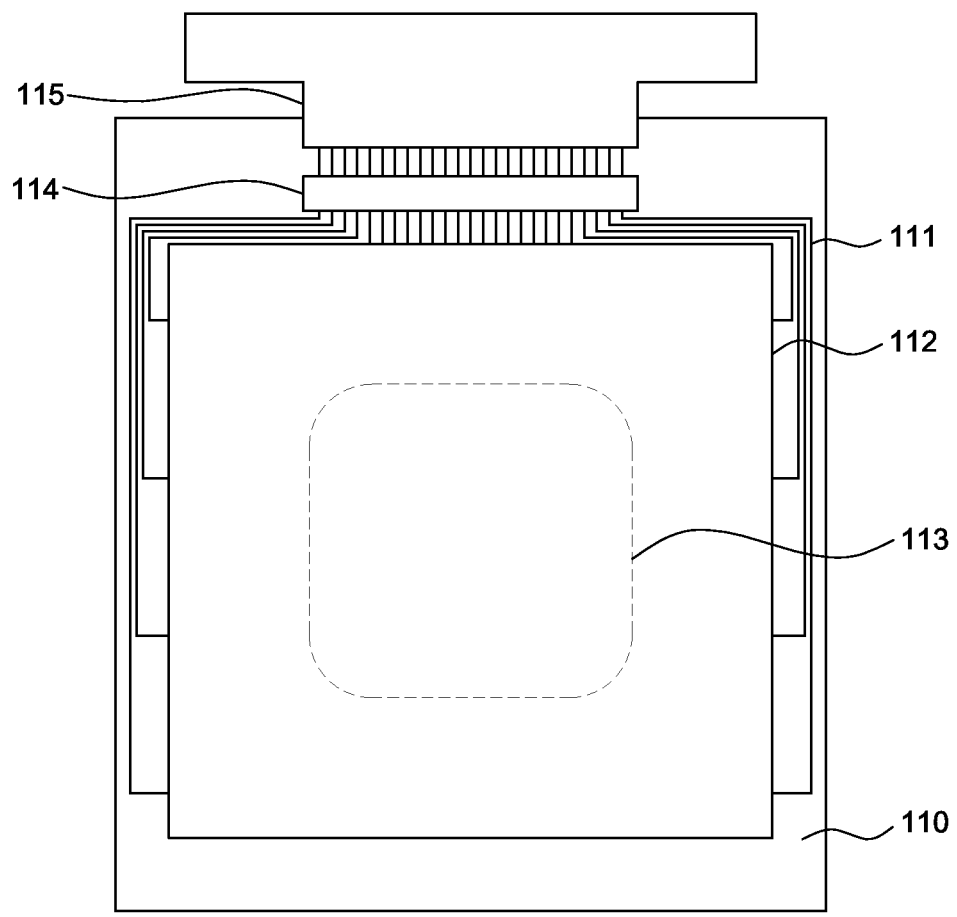
FIG. 1 is a schematic plan view of a general organic light emitting display panel provided to describe a decrease in luminance of the organic light emitting display panel.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely bonded to or combined with each other and can be interlocked and operated in technically various ways, and the embodiments can be carried out independently of or in association with each other.

In the following, there will be described various configurations of an organic light emitting display panel including an auxiliary electrode for reducing an electric resistance of a common electrode according to an exemplary embodiment of the present disclosure.

Hereinafter, various exemplary embodiments of the present disclosure will be described in detail with reference to the accompanying drawings.

FIG. 1 is a schematic plan view of a general organic light emitting display panel provided to describe a decrease in luminance of the organic light emitting display panel.

Referring to FIG. 1, an organic light emitting display panel 100 includes a substrate 110 including an active area 112, a wiring electrode 111 connected with the active area 112, a substrate circuit 114 disposed on the substrate 110, and a circuit board 115 connected with the substrate circuit 114.

A display driving signal and a current are supplied through the wiring electrode 111 connected with the active area 112. A central portion of the active area 112 may include a luminance decreasing area 113 where luminance is decreased.

The luminance decreasing area 113 where luminance is decreased may be present at the central portion of the active area 112 of the organic light emitting display panel 100, or may be positioned at an edge of the active area 112 according to connectivity with the wiring electrode 111. Otherwise, the luminance decreasing area 113 may be present as being distributed in many areas of the active area 112, or may be present in a plurality of areas within the active area 112 according to a method of supplying a current through the wiring electrode 111.

Figure 2A:
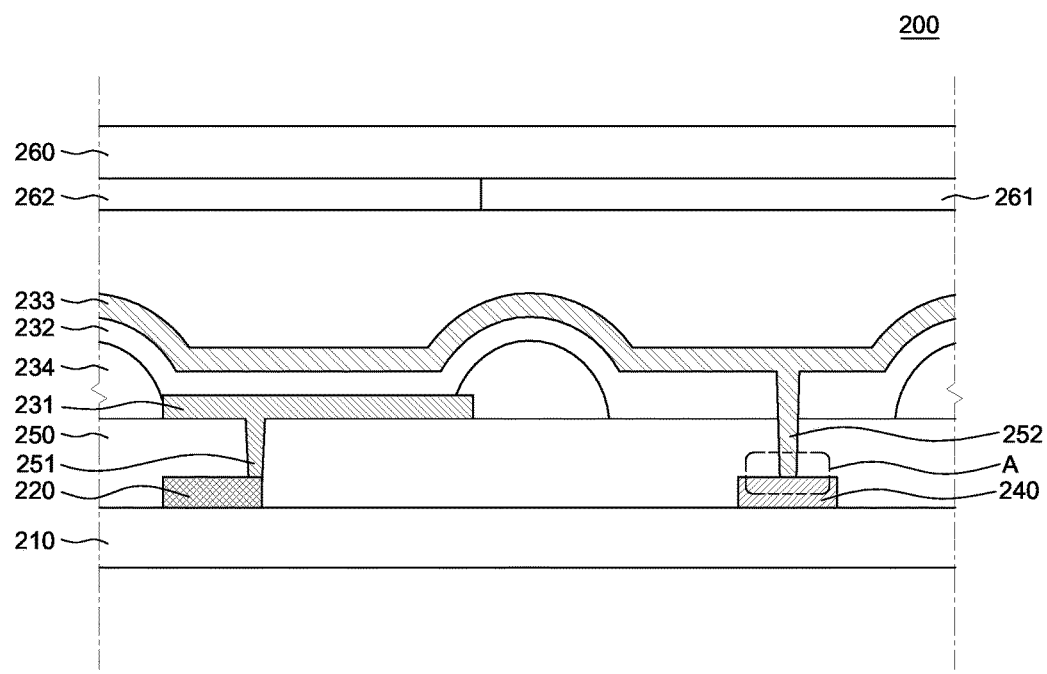
FIG. 2A is a schematic cross-sectional view of an organic light emitting display panel provided to describe a connection relationship between a common electrode and an auxiliary electrode according to an exemplary embodiment of the present disclosure.

FIG. 2A is a schematic cross-sectional view of an organic light emitting display panel provided to describe connectivity between a common electrode and an auxiliary electrode according to an exemplary embodiment of the present disclosure.

Referring to FIG. 2A, an organic light emitting display panel 200 includes a substrate 210, a driving element 220, a pixel electrode 231, an organic light emitting layer 232, a common electrode 233, a bank 234, an auxiliary electrode 240, a flattening layer 250, an upper substrate 260, a black matrix 261, and a color filter 262.

The driving element 220 and the auxiliary electrode 240 are disposed on the substrate 210. Herein, the driving element 220 and the auxiliary electrode 240 may be disposed as being separated from each other on the substrate 210.

The flattening layer 250 includes a first contact hole 251 corresponding to at least the driving element 220 and at least one second contact hole 252. That is, the flattening layer 250 is disposed so as to cover the driving element 220 and the auxiliary electrode 240, and includes the first contact hole 251 formed on the driving element 220 and the at least one second contact hole 252 formed on the auxiliary electrode 240.

The pixel electrode 231 is disposed on the flattening layer 250, and the pixel electrode 231 is controlled as being connected with the driving element 220 through the first contact hole 251.

The organic light emitting layer 232 is disposed on the pixel electrode 231. The common electrode 233 is disposed on the organic light emitting layer 232. The organic light emitting layer 232 is configured to emit light by electrons and holes injected from the pixel electrode 231 and the common electrode 233. In addition, the organic light emitting layer 232 includes a hole injection layer, a hole transporting layer, an electron transporting layer, an electron injection layer, and the like in order to smoothly inject electrons and holes.

The bank 234 is disposed on the flattening layer 250. To be specific, the bank 234 may be disposed on the flattening layer 250 so as to cover a part of the pixel electrode 231. Further, a unit pixel area is defined by the bank 234. The organic light emitting layer 232 is disposed on the entire surface of the substrate 210 so as to cover the bank 234, the pixel electrode 231, and the flattening layer 250. The common electrode 233 is disposed on the entire surface of the substrate 210 so as to cover the organic light emitting layer 232.

The common electrode 233 may be configured as a transparent electrode of ITO, IZO, or the like, in order to transmit light emitted from the organic light emitting layer 232. If the common electrode 233 is a transparent electrode, due to a high electric resistance as compared with that of a metal electrode, a current applied to the common electrode 233 may flow on the substrate 210 in a non-uniform manner depending on an electric resistance.

In this case, at least one auxiliary electrode 240 is disposed on the substrate 210, and the auxiliary electrode 240 is electrically connected with the common electrode 233. Thus, it is possible to reduce the electric resistance of the common electrode 233.

The auxiliary electrode 240 may be formed of at least one material selected from materials used for a source electrode, a drain electrode, and a gate electrode of a thin film transistor constituting the driving element 220.

The auxiliary electrode 240 disposed on the substrate 210 and the common electrode 233 are connected with each other through the second contact hole 252 in the flattening layer 250 and are connected by an undercut pattern of the second contact hole 252. Details thereof will be described later.

Figure 2B:
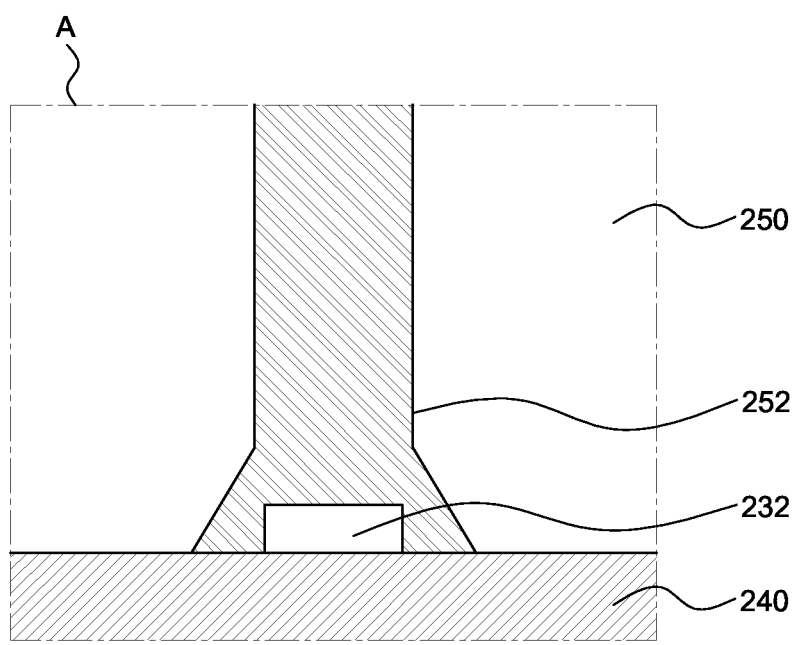
FIG. 2B is an enlarged view of a region A of FIG. 2A and a schematic cross-sectional view provided to describe a connection relationship between the common electrode and the auxiliary electrode at a contact hole having an undercut pattern in a flattening layer according to an exemplary embodiment of the present disclosure.

FIG. 2B is an enlarged view of a region A of FIG. 2A. In addition, FIG. 2B is a schematic cross-sectional view provided to describe connectivity between the common electrode and the auxiliary electrode at a contact hole having an undercut pattern in a flattening layer according to an exemplary embodiment of the present disclosure.

As described above, connectivity between the auxiliary electrode 240 and the common electrode 233 will be described with reference to FIG. 2B. The second contact hole 252 has an undercut pattern at a contact position between the flattening layer 250 and the auxiliary electrode 240 in order to smoothly connect the auxiliary electrode 240 with the common electrode 233. Accordingly, a diameter of a cross section of the second contact hole 252 at an interface with respect to the auxiliary electrode 240 may be greater than a diameter of a cross section of the second contact hole 252 at a top surface of the flattening layer 250.

The second contact hole 252 having the undercut pattern can be formed by an exposure process or the like.

As a method of disposing the second contact hole 252 in the flattening layer 250, there is a method of causing an over-exposure effect at a position adjacent to the auxiliary electrode 240 by adjusting an exposure time.

If an exposure or the like is used while the second contact hole 252 is disposed on the auxiliary electrode 240, light used during the exposure may be reflected toward the flattening layer 250 by the auxiliary electrode 240. Thus, the second contact hole 252 having the undercut pattern may be formed.

Further, a material of the organic light emitting layer 232 has a lower step coverage than a material of the common electrode 233, and, thus, it cannot reach the inside of the undercut pattern of the second contact hole 252. The common electrode 233 reaches the inside of the undercut pattern of the second contact hole 252, and, thus, it can be connected with the auxiliary electrode 240. To be specific, the organic light emitting layer 232 is disposed on a top surface of the auxiliary electrode 240 so as to open at least a part of the auxiliary electrode 240. The organic light emitting layer 232 disposed on the auxiliary electrode 240 may be covered with the common electrode 233 extended to the inside of the second contact hole 252. Accordingly, even if the organic light emitting layer 232 is present on the auxiliary electrode 240, the common electrode 233 may be disposed on the auxiliary electrode 240 according to the undercut pattern and easily connected with the auxiliary electrode 240.

Meanwhile, the upper substrate 260 corresponding to the substrate 210 and including the color filter layer 262 and the black matrix 261 is disposed on the common electrode 233. To be specific, the upper substrate 260 is disposed on the common electrode 233 such that the black matrix 261 corresponds to the auxiliary electrode 240 and the color filter layer 262 corresponds to the pixel electrode 231. Herein, the substrate 210 and the upper substrate 260 may be bonded to each other with an adhesive material such as resin.

The color filter layer 262 of the upper substrate 260 may be selected from red, blue, and green color filters. The color filter layer 262 may be optionally included depending on a wavelength of a light emitted from the organic light emitting layer 232.

Meanwhile, although not illustrated in FIG. 2A, a barrier layer may be further disposed between the driving element 220 and the substrate 210. Also, an encapsulation layer may be further disposed on the common electrode 233.

Figure 3:
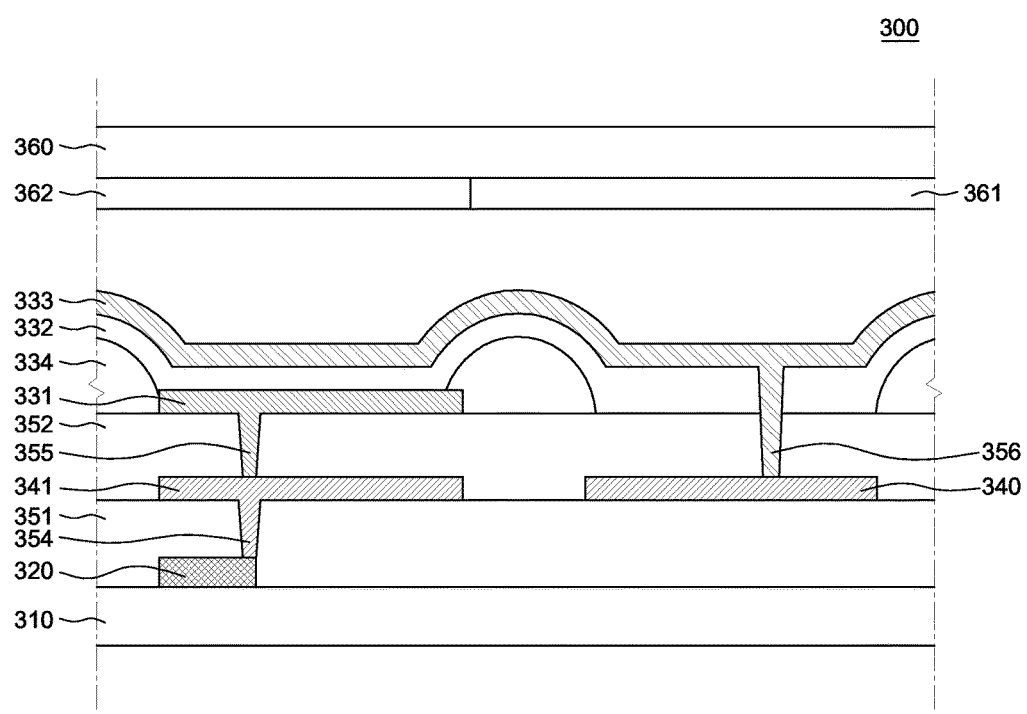
FIG. 3 is a schematic cross-sectional view provided to describe a connection relationship between an auxiliary electrode and a common electrode of an organic light emitting display panel including a dual flattening layer according to an exemplary embodiment of the present disclosure.

FIG. 3 is a schematic cross-sectional view provided to describe a connection relationship between an auxiliary electrode and a common electrode of an organic light emitting display panel including a dual flattening layer according to an exemplary embodiment of the present disclosure. An organic light emitting display panel 300 illustrated in FIG. 3 is substantially the same as the organic light emitting display panel 200 illustrated in FIG. 2A except that a second flattening layer 352 and a connection electrode 341 are further included.

Referring to FIG. 3, in the organic light emitting display panel 300, a first flattening layer 351 including a first contact hole 354 is disposed on a substrate 310 including a driving element 320.

The connection electrode 341 and an auxiliary electrode 340 are disposed on the first flattening layer 351. The connection electrode 341 corresponds to the driving element 320 and is connected with the driving element 320 through the first contact hole 354.

The second flattening layer 352 is disposed on the first flattening layer 351. Herein, the second flattening layer 352 may be disposed so as to cover the connection electrode 341 and the auxiliary electrode 340.

The first flattening layer 351 and the second flattening layer 352 may be formed of the same material, or may be formed of different materials for suppressing infiltration of moisture and oxygen.

A pixel electrode 331 and a bank 334 are formed on the second flattening layer 352, and an organic light emitting layer 332 and a common electrode 333 are disposed so as to correspond to the substrate 310.

A second contact hole 355 and a third contact hole 356 are formed in the second flattening layer 352. The connection electrode 341 is connected with the pixel electrode 331 through the second contact hole 355. The common electrode 333 is connected with the auxiliary electrode 340 through the third contact hole 356.

The driving element 320 may be a thin film transistor including a source electrode, a drain electrode, and a gate electrode. The auxiliary electrode 340 and the connection electrode 341 may be formed of at least one material selected from materials used for the source electrode, the drain electrode, and the gate electrode.

The organic light emitting layer 332 may be a white, blue, red, or green organic light emitting layer. The organic light emitting layer 332 may have a multilayer structure including a hole injection layer, a hole transporting layer, an electron transporting layer, and an electron injection layer in order to smoothly move electrons and holes.

The common electrode 333 is connected with the auxiliary electrode 340 through the third contact hole 356. The third contact hole 356 may have an undercut pattern in order to smoothly connect the common electrode 333 with the auxiliary electrode 340.

Meanwhile, an upper substrate 360 corresponding to the substrate 310 and bonded with an adhesive layer such as resin may be further included.

The upper substrate 360 may further include a color filter layer 362 and a black matrix 361. The color filter layer 362 may be a color filter selected from red, blue, and green color filters, and may be optionally omitted depending on the organic light emitting layer 332.

Although exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes and are not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

What is claimed is:

1. An organic light emitting display panel comprising:
   a substrate including at least one driving element and one auxiliary electrode;
   a flattening layer disposed on the driving element and including a first contact hole corresponding to the driving element and at least one second contact hole;
   a pixel electrode connected to the driving element through the first contact hole;
   an organic light emitting layer disposed on the pixel electrode; and
   a common electrode disposed on the organic light emitting layer and connected to the auxiliary electrode through the second contact hole,
   wherein the second contact hole has an undercut pattern on the auxiliary electrode, wherein a portion of the organic light emitting layer is disposed on a first portion of an upper part of the auxiliary electrode corresponding to the undercut pattern of the second contact hole,
   wherein the common electrode is connected to a second portion of the auxiliary electrode excluding the portion of the upper part of the auxiliary electrode on which the portion of the organic light emitting layer is disposed such that the portion of the organic light emitting layer is surrounded by the common electrode extended to the inside of the second contact hole so as to expose at least a part of the auxiliary electrode, and
   wherein the first portion and the second portion are disposed in a same plane.

2. The organic light emitting display panel according to claim 1,
   wherein a diameter of a cross section of the second contact hole at an interface with respect to the auxiliary electrode is greater than a diameter of a cross section of the second contact hole at a top surface of the flattening layer.

3. The organic light emitting display panel according to claim 1, further comprising:

a plurality of banks disposed on the flattening layer,
wherein the organic light emitting layer and the common electrode are disposed on an entire surface of the substrate.

4. The organic light emitting display panel according to claim 1,
wherein the driving element includes a gate electrode, a source electrode, and a drain electrode, and
wherein the auxiliary electrode is formed of the same material as at least one of the gate electrode, the source electrode, and the drain electrode.

5. The organic light emitting display panel according to claim 1, further comprising:
an encapsulation layer disposed on the common electrode; and
an upper substrate facing the substrate.

6. The organic light emitting display panel according to claim 5, wherein the upper substrate further includes a color filter and a black matrix.

7. The organic light emitting display panel according to claim 1, further comprising:
a barrier layer disposed between the driving element and the substrate.

8. The organic light emitting display panel according to claim 1, wherein the common electrode is a transparent electrode.

9. The organic light emitting display panel according to claim 1,
wherein the auxiliary electrode is opened and electrically connected with the common electrode extended to the inside of the second contact hole.

10. An organic light emitting display panel comprising:
a substrate including at least one driving element;
a first flattening layer disposed on the driving element and including a first contact hole;
at least one connection electrode and one auxiliary electrode disposed on the first flattening layer;
a second flattening layer disposed on the first flattening layer and including a second contact hole and a third contact hole;
a pixel electrode disposed on the second flattening layer;
an organic light emitting layer disposed on the pixel electrode; and
a common electrode disposed on the organic light emitting layer,
wherein the driving element is connected to the at least one connection electrode through the first contact hole,
wherein the at least one connection electrode is connected to the pixel electrode through the second contact hole,
wherein the auxiliary electrode is connected to the common electrode through the third contact hole,
wherein the third contact hole has an undercut pattern on the auxiliary electrode,
wherein the second flattening layer and the organic light emitting layer are composed of different materials,
wherein a portion of the organic light emitting layer is disposed on a first portion of an upper part of the auxiliary electrode corresponding to the undercut pattern of the second contact hole,
wherein the common electrode is connected directly to a second portion of the auxiliary electrode excluding the portion of the upper part of the auxiliary electrode on which the portion of the organic light emitting layer is disposed such that the portion of the organic light emitting layer is surrounded by the common electrode extended to the inside of the second contact hole so as to expose at least a part of the auxiliary electrode, and
wherein the first portion and the second portion are disposed in a same plane.

11. The organic light emitting display panel according to claim 10,
wherein the driving element includes a gate electrode, a source electrode, and a drain electrode, and
wherein the auxiliary electrode is formed of the same material as at least one of the gate electrode, the source electrode, and the drain electrode.

12. The organic light emitting display panel according to claim 10, further comprising:
an encapsulation layer disposed on the common electrode; and
an upper substrate facing the substrate.

13. The organic light emitting display panel according to claim 12, wherein the upper substrate further includes a color filter and a black matrix.

14. The organic light emitting display panel according to claim 10, further comprising:
a barrier layer disposed between the driving element and the substrate.

15. The organic light emitting display panel according to claim 10, wherein the connection electrode and the auxiliary electrode are formed of the same material.

16. The organic light emitting display panel according to claim 10, wherein the common electrode is a transparent electrode.

17. The organic light emitting display panel according to claim 10, wherein the auxiliary electrode is opened and electrically connected with the common electrode extended to the inside of the second contact hole.

* * * * *